United States Patent
Aigo et al.

(10) Patent No.: US 8,901,570 B2
(45) Date of Patent: Dec. 2, 2014

(54) EPITAXIAL SILICON CARBIDE SINGLE CRYSTAL SUBSTRATE AND PROCESS FOR PRODUCING THE SAME

(75) Inventors: Takashi Aigo, Tokyo (JP); Hiroshi Tsuge, Tokyo (JP); Taizo Hoshino, Tokyo (JP); Tatsuo Fujimoto, Tokyo (JP); Masakazu Katsuno, Tokyo (JP); Masashi Nakabayashi, Tokyo (JP); Hirokatsu Yashiro, Tokyo (JP)

(73) Assignee: Nippon Steel & Sumitomo Metal Corporation, Tokyo (JP)

( * ) Notice: Subject to any disclaimer, the term of this patent is extended or adjusted under 35 U.S.C. 154(b) by 0 days.

(21) Appl. No.: 13/697,211

(22) PCT Filed: May 10, 2011

(86) PCT No.: PCT/JP2011/061124
§ 371 (c)(1),
(2), (4) Date: Nov. 9, 2012

(87) PCT Pub. No.: WO2011/142470
PCT Pub. Date: Nov. 17, 2011

(65) Prior Publication Data
US 2013/0049014 A1 Feb. 28, 2013

(30) Foreign Application Priority Data

May 11, 2010 (JP) ................. 2010-109105

(51) Int. Cl.
*H01L 29/15* (2006.01)
(Continued)

(52) U.S. Cl.
CPC .... *H01L 21/02433* (2013.01); *H01L 21/02507* (2013.01);
(Continued)

(58) Field of Classification Search
USPC ............................................ 257/77, E29.104
See application file for complete search history.

(56) References Cited

U.S. PATENT DOCUMENTS 6,306,211 B1    10/2001   Takahashi et al.
2002/0158251 A1* 10/2002  Takahashi et al. ............ 257/70
(Continued)

FOREIGN PATENT DOCUMENTS

JP    2000-340512 A    12/2000
JP    2002-329670 A    11/2002
(Continued)

OTHER PUBLICATIONS

Aigo et al., "Nitrogen Incorporation Mechanism and Dependence of Site-Competition Epitaxy on the Total Gas Flow Rate for 6H—SiC Epitaxial Layers Grown by Chemical Vapor Deposition", Jpn. J. Appl. Phys., vol. 40, part 1, No. 4A, Apr. 2001, pp. 2155-2158.

(Continued)

*Primary Examiner* — Cuong Q Nguyen
*Assistant Examiner* — Nishath Yasmeen
(74) *Attorney, Agent, or Firm* — Birch, Stewart, Kolasch & Birch, LLP

(57) ABSTRACT

Provided is an epitaxial silicon carbide single-crystal substrate in which a silicon carbide epitaxial film having excellent in-plane uniformity of doping density is disposed on a silicon carbide single-crystal substrate having an off angle that is between 1° to 6°. The epitaxial film is grown by repeating a dope layer that is 0.5 μm or less and a non-dope layer that is 0.1 μm or less. The dope layer is formed with the ratio of the number of carbon atoms to the number of silicon atoms (C/Si ratio) in a material gas being 1.5 to 2.0, and the non-dope layer is formed with the C/Si ratio being 0.5 or more but less than 1.5. The resulting epitaxial silicon carbide single-crystal substrate comprises a high-quality silicon carbide epitaxial film, which has excellent in-plane uniformity of doping density, on a silicon carbide single-crystal substrate having a small off angle.

2 Claims, 7 Drawing Sheets

(51) Int. Cl.
*H01L 31/0312* (2006.01)
*H01L 21/02* (2006.01)
*C30B 25/02* (2006.01)
*C30B 29/36* (2006.01)
*C30B 25/18* (2006.01)

(52) U.S. Cl.
CPC ......... *C30B 25/02* (2013.01); *H01L 21/02573* (2013.01); *C30B 29/36* (2013.01); *H01L 21/02529* (2013.01); *H01L 21/02447* (2013.01); *H01L 21/0262* (2013.01); *H01L 21/02378* (2013.01); *C30B 25/18* (2013.01)

USPC .............................. 257/77; 257/190; 257/76

(56) References Cited

U.S. PATENT DOCUMENTS

| | | | |
|---|---|---|---|
| 2006/0011128 A1* | 1/2006 | Ellison et al. | 117/84 |
| 2007/0015308 A1* | 1/2007 | Shenoy et al. | 438/92 |
| 2008/0213536 A1* | 9/2008 | Maruyama et al. | 428/141 |
| 2009/0114148 A1* | 5/2009 | Stahlbush et al. | 117/89 |

FOREIGN PATENT DOCUMENTS

| | | | |
|---|---|---|---|
| JP | 2003-234301 A | 8/2003 | |
| JP | 2009-256138 A | 11/2009 | |

OTHER PUBLICATIONS

International Search Report mailed on Aug. 2, 2011, issued in PCT/JP2011/061124.

* cited by examiner

EPITAXIAL SILICON CARBIDE SINGLE CRYSTAL SUBSTRATE AND PROCESS FOR PRODUCING THE SAME

TECHNICAL FIELD

The present invention relates to an epitaxial silicon carbide single crystal substrate, and a process for producing the same.

BACKGROUND ART

Silicon carbide (SiC) is excellent in heat resistance and mechanical strength and is physically and chemically stable. Therefore, silicon carbide is attracting attention as an environment-resistant semiconductor material. In addition, in recent years, there have been increased demands for an SiC single crystal substrate, as a substrate for a high-frequency high-voltage resistant electronic device, etc.

In a case where electric power devices, high-frequency devices, etc., are to be manufactured by using an SiC single crystal substrate, it may be usually performed in general to epitaxially grow an SiC thin film on a substrate, by using a process called a chemical vapor deposition process (CVD process), or to directly implant thereinto a dopant by using an ion implantation process. In the latter case of the ion implantation process, annealing at a high temperature may be required after the implantation, and for this reason, the formation of a thin film using an epitaxial growth may be employed frequently.

In the case of forming a device on an epitaxial film, in order to stably produce a device as designed, the film thickness and doping density of the epitaxial film, particularly the wafer in-plane uniformity of the doping density, becomes important. In recent years, along with the progress toward a larger-size wafer, the area of a device is also increasing. From such a standpoint, the uniformity of the doping density becomes more important. In the case of an SiC epitaxial film to be formed on the currently mainstream 3- or 4-inch wafer, the in-plane uniformity of the doping density may be from 5 to 10% in terms of standard deviation/average value (σ/mean). However, in the case of the above-mentioned larger size wafer, this value should be reduced to 5% or less.

On the other hand, in the case of the substrate having a size of 3 inch or more, in view of the reduction in the density of defects such as basal plane dislocation, or increase in the yield of a substrate to be produced from an SiC ingot, a substrate having an off-angle of about 4° or less rather than that having a conventional off-angle of 8° has been used. In the case of the epitaxial growth on a substrate having such a small off-angle, the ratio (C/Si ratio) of the number of carbon atoms to the number of silicon atoms in the raw material gas to be flowed during the growth may be generally set to be lower than the conventional ratio. In this connection, as the off-angle becomes smaller, there may be developed a tendency that the number of steps on the surface is decreased and step-flow growth is less liable to occur, so as to cause an increase in the step bunching or epitaxial defects. Accordingly, the above ratio may be set low so as to suppress such a tendency. However, when the C/Si ratio is decreased, so-called site-competition may be noticeable and the introduction of impurity such as nitrogen atoms from the atmosphere may be increased during the epitaxial growth. The thus introduced nitrogen atoms may function as a donor in SiC, and supply electrons, to thereby increase the carrier density. On the other hand, because residual nitrogen is present in the growth atmosphere, the site-competition may occur even in a non-doped layer which has been formed without the addition of an impurity element. Accordingly, the residual carrier density in the case of a non-doped layer which has been grown by decreasing the C/Si ratio may become higher than that in the case of the conventional C/Si ratio. This will be described below by referring to FIG. 1.

In the case of a substrate having a conventional off-angle (8°), the growth thereon may be performed by setting the C/Si ratio to near X, and in this case, the residual carrier density in the non-doped layer is referred to as "$N_X$". Under this assumption, the residual carrier density in the non-doped layer to be grown at a low C/Si ratio of "Y" (usually, about 1.0), which is required when a film is to be grown on a substrate having an off-angle of about 4° or less, may become "$N_Y$" (usually on the order of 0.8 Lo $1 \times 10^{15}$ cm$^3$). On the other hand, the carrier level "$N_C$" which is required for the operation of device may be, for example, from 1 to $5 \times 10^{15}$ cm$^{-3}$. This value may be almost equal to the level of $N_Y$, and accordingly, when the C/Si ratio is Y, a layer having such a value close to the doping value, which is required for the operation of a device, is already obtained in an undoped state. Accordingly, in a case where nitrogen is intentionally introduced as a doping gas to control the carrier level of the layer so as to provide a value which is required for the operation of a device, the doping amount to be controlled may be smaller. Therefore, it may be difficult to obtain the uniformity of the doping density, as compared with that in the case of a 8°-off substrate. Further, to be exact, the C/Si ratio may not be constant in all of portions on a wafer, and the C/Si ratio may be locally smaller than Y. In this case, as seen from FIG. 1, the residual carrier density may become larger than $N_C$.

FIG. 2a shows a doping density profile when the doping is performed at a C/Si ratio in the portion of Y, and FIG. 2b shows a doping density profile when the doping is performed in the same wafer at a C/Si ratio in the portion of less than Y (approximately from 0.8 to 0.9). If the residual carrier densities at respective portions are referred to as $N_{B1}$ and $N_{B2}$, usually, $N_{B1}$ may be approximately from 0.8 to $1 \times 10^{15}$ cm$^{-3}$, and $N_{B2}$ may be approximately from 1 to $3 \times 10^{15}$ cm$^{-3}$, and accordingly, a relationship of $N_{B1} < N_{B2}$=about $N_C$ is established. If the doping is performed so that $N_C$ can be obtained in the portion of FIG. 2a in the wafer, the doping amount may be $N_C$-$N_{B1}$ and therefore, the doping amount in the portion of FIG. 2b may necessarily become $N_C$-$N_{B1}$+$N_{B2}$. Accordingly, $N_{B2}$-$N_{B1}$ may be doping variation in the portions of FIGS. 2a and 2b, and can be a value which is larger than about 10% of $N_C$. Such a phenomenon may be produced because the graph in FIG. 1 shows a large gradient at a C/Si ratio of near Y, which is required for the growth on a substrate having an off-angle of 4° or less. That is, despite a small variation of the C/Si ratio, the value of $N_{B2}$-$N_{B1}$ becomes large in the vicinity of Y, to thereby provide a large reduction in the uniformity of the in-plane distribution of the doping density.

Therefore, in an SiC epitaxial growth substrate, the application of which to a device may be expected in the near future, the wafer in-plane uniformity of the doping density may be deteriorated, due to the fact that when the off-angle of the substrate is changed from conventional 8° to about 4° or less, the growth therefor should be performed by reducing the C/Si ratio, and this may be a problem for the application thereof to a device.

In this connection, the present inventors have proposed a method for forming a high-quality epitaxial film on an SiC single crystal substrate having an off-angle of 4° or less, wherein a layer which has been grown by setting the ratio of the numbers of carbon atoms and silicon atoms contained in the material gas for the epitaxial film (C/Si) to be 0.5 or more and less than 1.0 (defect-reduced layer), and a layer which has been grown by setting C/Si to be 1.0 or more and 1.5 or less (active layer) are disposed (see Patent Document 1). However, this method has a purpose of obtaining an epitaxial film which has been reduced in the triangular epitaxial defect or in the surface roughening, and but does not teach the means for directly securing the uniformity of the doping density of the epitaxial film in the wafer plane.

PRIOR ART DOCUMENT

Patent Document

[Patent Document 1] JP-A (Japanese Unexamined Patent Publication; KOKAI) No. 2009-256138

SUMMARY OF THE INVENTION

Problems to be Solved by the Invention

An object of the present invention is to provide an epitaxial SiC single crystal substrate having a high-quality epitaxial film, which is excellent in the wafer in-plane uniformity of the doping density so that variation is reduced even when the ratio of the numbers of carbon atoms and silicon atoms (C/Si) is set to a low value, wherein a substrate having an off-angle of 1 to 6° is used in the epitaxial growth; and a process for producing the same.

Means for Solving the Problem

The present inventors have found that it is very effective in achieving the above object to form, during epitaxial growth, a plurality of non-doped layers to be formed without the addition of an impurity element, and a plurality of doped layers to be formed with the addition of an impurity element, wherein the C/Si ratios and the layer thicknesses are changed at the time of the growth of the non-doped layer and at the time of the growth of the doped layer.

The present invention is based on the above discovery. More specifically, the epitaxial silicon carbide single crystal substrate according to the present invention has a silicon carbide epitaxial film, which has been formed on a silicon carbide single crystal substrate having an off-angle of 1 to 6°, by use of a chemical vapor deposition method, wherein the epitaxial film has two or more doped layers and two or more non-doped layers, which have been formed by alternately stacking a doped layer having a thickness of 0.5 µm or less, and being formed while adding an impurity element; and a non-doped layer having a thickness of 0.1 µm or less, and being formed without the addition of an impurity element.

For example, the present invention may include the following embodiments.

[1] An epitaxial silicon carbide single crystal substrate having a silicon carbide epitaxial film, which has been formed on a silicon carbide single crystal substrate having an off-angle of 1 to 6°, by use of a chemical vapor deposition method, wherein the epitaxial film has two or more doped layers and two or more non-doped layers, which have been formed by alternately stacking a doped layer having a thickness of 0.5 µm or less, and being formed while adding an impurity element; and a non-doped layer having a thickness of 0.1 µm or less, and being formed without the addition of an impurity element.

[2] The epitaxial silicon carbide single crystal substrate according to [1], wherein the doped layer is formed by setting the ratio of numbers of carbon and silicon atoms (C/Si) contained in a raw material gas for epitaxial film to be 1.5 or more and 2.0 or less, and the non-doped layer is formed by setting the ratio of numbers of carbon and silicon atoms (C/Si) contained in a raw material gas for epitaxial film to be 0.5 or more and less than 1.5.

[3] The epitaxial silicon carbide single crystal substrate according to embodiment [1], wherein the thickness of the doped layer is larger than the thickness of the non-doped layer.

[4] The epitaxial silicon carbide single crystal substrate according to embodiment [1], wherein the density of doping atom number of the doped layer is $1 \times 10^{15}$ cm$^{-3}$ or more.

[5] A process for producing an epitaxial silicon carbide single crystal substrate by forming a silicon carbide epitaxial film on a silicon carbide single crystal substrate having an off-angle of 1 to 6° by use of a chemical vapor deposition method; the process comprising alternately the steps of:

growing a doped layer having a thickness of 0.5 µm or less, and being formed while adding an impurity element by setting the ratio of numbers of carbon and silicon atoms (C/Si) contained in a raw material gas for epitaxial film to be 1.5 or more and 2.0 or less, and growing a non-doped layer having a thickness of 0.1 µm or less, and being formed without the addition of an impurity element by setting the ratio of numbers of carbon and silicon atoms (C/Si) contained in a raw material gas for epitaxial film to be 0.5 or more and less than 1.5, to thereby form a silicon carbide epitaxial film having two or more doped layers and two or more non-doped layers.

Effect of the Invention

The present invention can provide a high-quality epitaxial SiC single crystal substrate, wherein an epitaxial film is formed on a substrate having an off-angle of 1 to 6°, and the epitaxial film is excellent in the wafer in-plane uniformity of the doping density.

In addition, the production process according to the present invention uses a CVD (Chemical Vapor Deposition) method, so that the structure of the apparatus to be used therefor can be simplified and excellent controllability can be realized, and an epitaxial film having high uniformity and high reproducibility can be obtained.

Further, a device using the epitaxial SiC single crystal substrate according to the present invention can be formed on a high-quality epitaxial film which is excellent in the wafer in-plane uniformity of the doping density, so that the characteristics and yield of the device can be enhanced.

BRIEF DESCRIPTION OF THE DRAWINGS

FIG. 7a is a graph showing one example of the doping density profile when the doping is performed according to one embodiment of the process of the present invention in the same place as that in FIG. 2a.

MODE FOR CARRYING OUT THE INVENTION

Specific contents of the present invention will be described below.

First, epitaxial growth on an SiC single crystal substrate is described.

The apparatus which is suitably usable for the epitaxial growth in the present invention may be a horizontal CVD apparatus. The CVD process may be a growth method excellent in controllability and reproducibility of the epitaxial film, because the growth of the film can be adjusted by on-off control of a raw material gas, etc.

Figure 3:
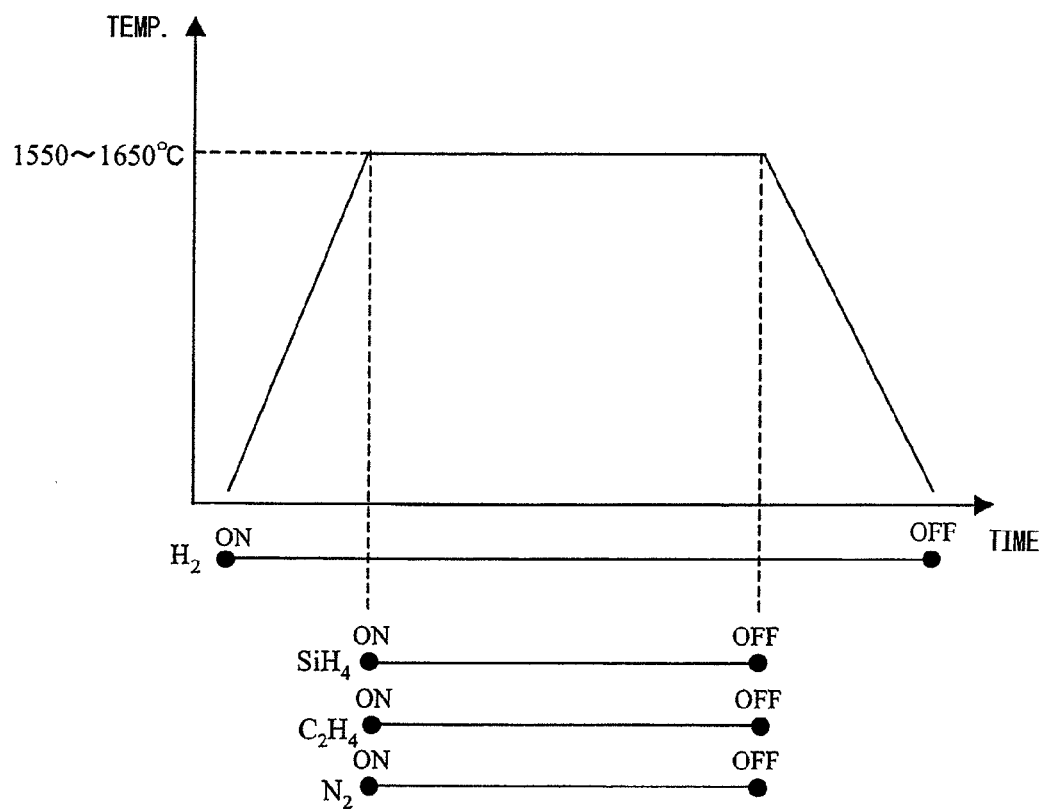
FIG. 3 is a graph showing one example of the typical growth sequence at the time of performing conventional epitaxial growth.

A typical growth sequence to be used in the epitaxial growth by a conventional process is shown in FIG. 3, together with the gas introduction timing to be used therefor. At first, a substrate is placed in a growth furnace, the inside of the growth furnace is evacuated, and then the pressure may preferably be adjusted to be approximately from $1 \times 10^4$ to $3 \times 10^4$ Pa, by introducing a hydrogen gas. Subsequently, the temperature of the growth furnace may preferably be raised while keeping the pressure constant, and when the growth temperature preferably reaches $T_1$ of 1,550 to 1,650° C., raw material gases (such as $SiH_4$, $C_2H_4$ and $N_2$ gas as a doping gas) may be introduced so as to start the epitaxial growth. The flow rate of $SiH_4$ may preferably be from 40 to 50 cm$^3$/min, and the flow rate of $C_2H_4$ may preferably be from 20 to 40 cm$^3$/min. The growth rate of the silicon carbide film may preferably be adjusted to 6 to 7 μm/hr.

The film thickness of a epitaxial film generally utilized for a device, etc., may be about 10 μm, and the above growth rate may be determined by taking into account the productivity based on this film thickness.

After the epitaxial growth for a predetermined time, the introduction of the raw material gases (i.e., $SiH_4$, $C_2H_4$ and $N_2$ gas) is stopped when a predetermined film thickness is obtained, and the temperature of the growth furnace is decreased, while only flowing a hydrogen gas.

After the temperature is decreased to normal (or room) temperature, the introduction of the hydrogen gas is stopped, and the inside of the growth furnace is evacuated. Further, the growth furnace may be returned to the atmospheric pressure by introducing thereinto an inert gas, and the substrate is taken out.

Figure 4:
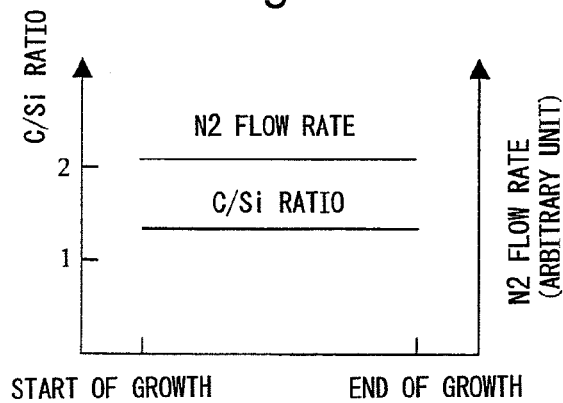
FIG. 4 is a graph showing the changes in the C/Si ratio and the N$_2$ gas flow rate at the time of performing conventional epitaxial growth.

FIG. 4 shows one suitable example of changes in the C/Si ratio and $N_2$ gas flow rate, when the growth is performed by the above conventional method. In the embodiment shown in FIG. 4, the C/Si ratio and the $N_2$ gas flow rate are not changed and kept constant, from the start to the end of growth.

Figure 5:
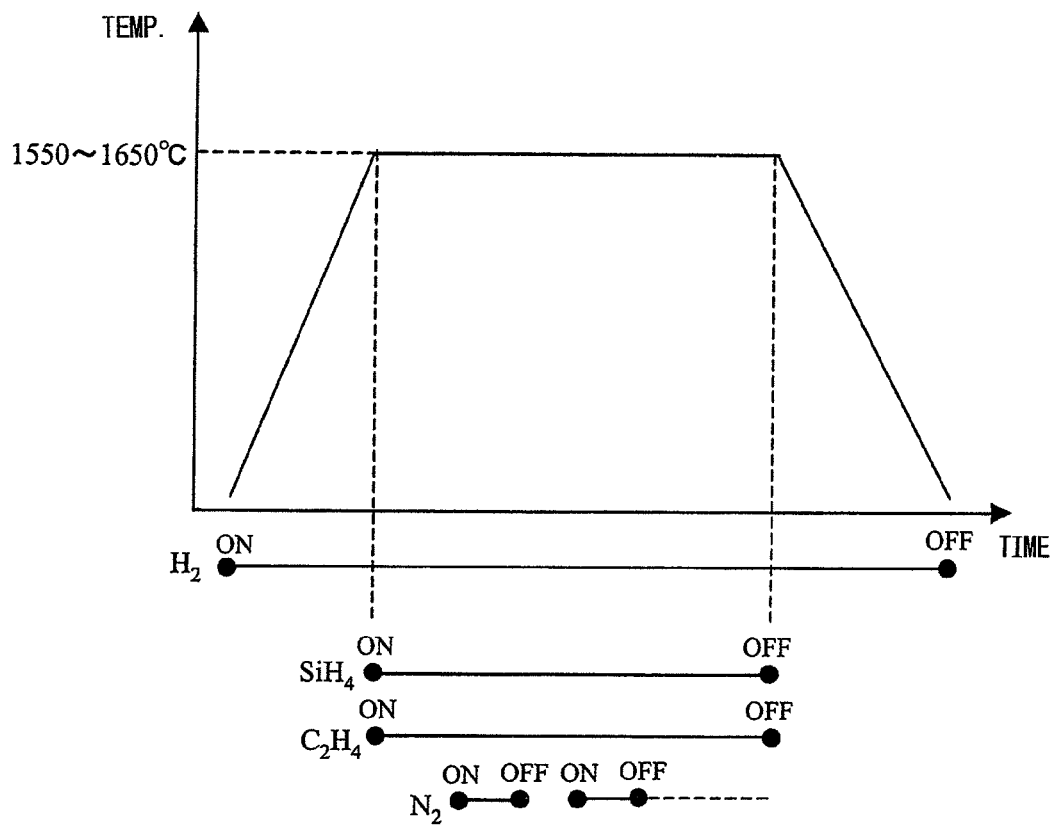
FIG. 5 is a graph showing one example of the growth sequence at the time of performing epitaxial growth according to one embodiment of the process of the present invention.

Next, another embodiment of the present invention is described by referring to the growth sequence of FIG. 5. The procedure from the setting of a SiC single crystal substrate to the starting of the growth may be the same, as that in the case of the embodiment of FIG. 3. Immediately after the start of the growth, a non-doped layer may be grown to about 0.1 μm by adjusting the flow rates of $SiH_4$ and $C_2H_4$ such that the ratio therebetween becomes preferably less than 1.5 in terms of the C/Si ratio. Subsequently, the layer may be grown to preferably about 0.2 μm by adjusting the flow rates of $SiH_4$ and $C_2H_4$ such that the ratio therebetween becomes preferably 1.5 or more in terms of the C/Si ratio, and at this time, nitrogen as the doping gas may be introduced to form a doped layer.

Thereafter, a non-doped layer and a doped layer may be repeatedly grown, and at the point of time at which a desired film thickness is obtained, the introduction of $SiH_4$, $C_2H_4$ and $N_2$ gases may be stopped. The subsequent procedure may be the same as in the case of FIG. 3.

Figure 6:
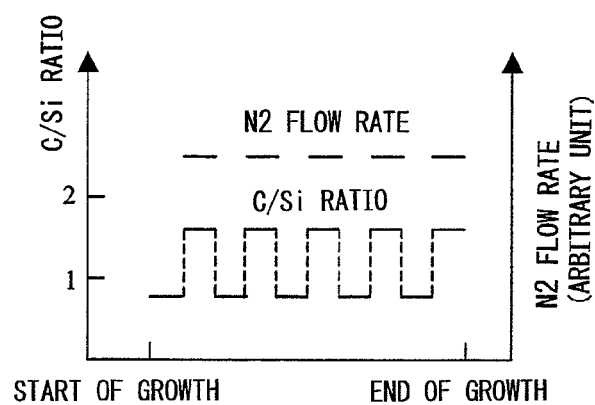
FIG. 6 is a graph showing one example of the changes in the C/Si ratio and the $N_2$ gas flow rate at the time of performing epitaxial growth according to one embodiment of the process of the present invention.

FIG. 6 shows one example of the changes in the C/Si ratio and the $N_2$ gas flow rate in the embodiment of FIG. 5. In this way, a non-doped layer may be grown at a low C/Si ratio, and a doped layer may be grown at a high C/Si ratio, whereby the doping can be performed in a state such that site-competition is hardly liable to occur, and accordingly, the doping excellent in controllability can be performed. Further, in the present invention, the thickness of the non-doped layer may be made thinner in total, so that in-plane non-uniformity of the doping density as described hereinabove can also be suppressed. This point will be described below by referring to one example by referring to FIG. 7.

Figure 1:
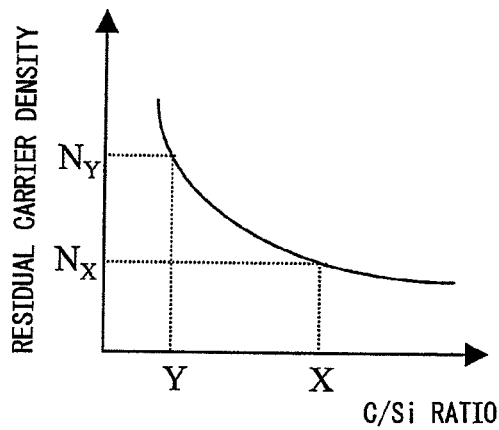
FIG. 1 is a graph showing a relationship between C/Si ratio and residual carrier density.
Figure 2A:
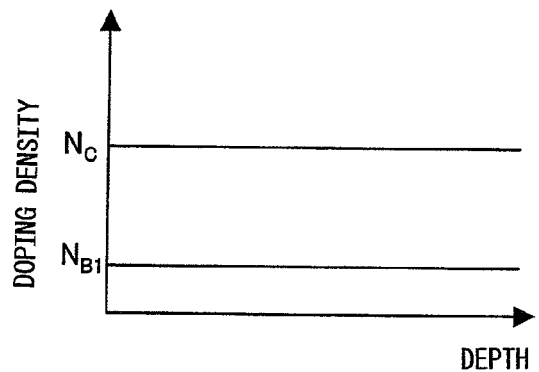
FIG. 2a is a graph showing one example of the doping density profile, when the doping is performed in a portion where the residual carrier density is lower than that of the carrier level necessary for the operation of a device.
Figure 7A:
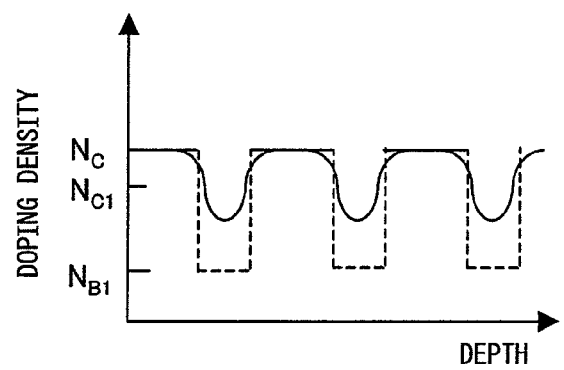

FIG. 7a shows one example of the doping profile when the doping is performed in the same place as that in the case of FIG. 2a, by applying the present invention thereto. When an ideal doping profile is obtained, a doping density as shown by the dotted line in the figure may be provided. That is, in the doped layer which has been formed while introducing nitrogen as the doping gas, the C/Si ratio may be set to 1.5 or more, which is higher than the value Y in FIG. 1, and therefore, the doping may be performed so as to provide $N_C$ without being affected by the residual carrier density.

On the other hand, in the non-doped layer to be formed without introducing nitrogen as the doping gas, the C/Si ratio may be the value Y (preferably about 1.0) in FIG. 1 and therefore, the residual carrier density exhibited thereby may be $N_{B1}$ in FIG. 2a. However, in practice, the doping density between the doped layer and the non-doped layer may be continuously changed and therefore, the effective doping density may be considered to be the value of about $N_{C1}$.

Figure 2B:
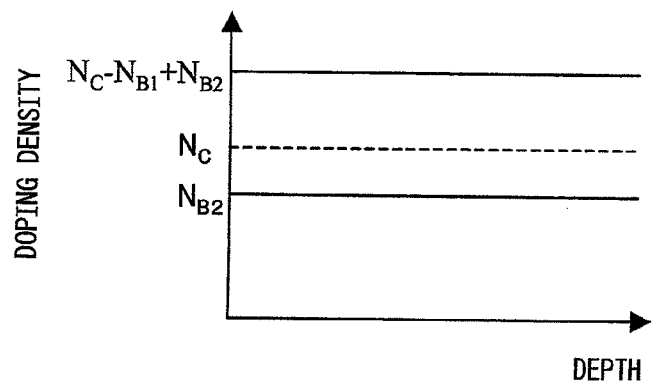
FIG. 2b is a graph showing one example of the doping density profile when the doping is performed in a portion where the residual carrier density is nearly equal to the carrier level necessary for the operation of a device.
Figure 7B:
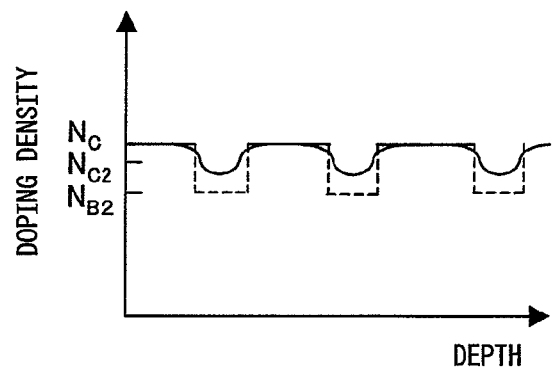
FIG. 7b is a graph showing one example of the doping density profile when the doping is performed according to one embodiment of the process of the present invention in the same place as that in FIG. 2b.

Further, FIG. 7b shows a doping density profile in the same place as that in FIG. 2b, in which the dotted line shows an ideal doping density, similarly to that in the case of FIG. 7a. In this case, the value of $N_C$ of the doped layer where the C/Si ratio is higher than the value Y in FIG. 1 (for example, the C/Si ratio is 1.5 or more) may not be affected by the residual impurity, and therefore it may become the same as $N_C$ in FIG.

7a. In this case, the residual carrier density of the non-doped layer where the C/Si ratio is a value (for example, from 0.8 to 0.9) which is smaller than the value Y in FIG. 1 may become the same as $N_{S2}$ in FIG. 2b, because of a high density of the residual impurity. The effective doping density may be considered to be about the value of $N_{C2}$. Accordingly, the difference between $N_{C1}$ and $N_{C2}$ may be reduced, and as a result, the in-plane uniformity of the doping density may be improved.

According to the present invention, in the epitaxial film on a substrate having an off-angle of 1 to 6°, an epitaxial film with high in-plane uniformity of doping can be obtained. However, a non-doped layer to be grown at a low C/Si ratio may be essential for the growth on a substrate having a small off-angle, and therefore, if the layer is too thin, an epitaxial defect or the like may be produced so as to deteriorate the film quality. On the other hand, if the layer is too thick, this may adversely affect the in-plane uniformity of the doping density in the entirety, and may cause a problem such that the resistance can be increased in the currently used device where a current is to be flowed perpendicularly to the substrate. Further, if the doped layer to be grown at a high C/Si ratio is smaller in the thickness than that of the non-doped layer, the contribution of the doped layer to the enhancement of the in-plane uniformity of the doping density may be reduced. On the other hand, if the layer thickness of the doped layer is too large, this may cause deterioration in the film quality.

Under these circumstances, as a result of the present inventors' study, it has been found that the thickness of the non-doped layer may preferably be 0.1 μm or less, more preferably from 0.05 to 0.1 μm. The thickness of the doped layer may preferably be 0.5 μm or less, more preferably from 0.2 to 0.5 μm. In addition, the ratio of the thickness of the doped layer to the thickness of the non-doped layer may preferably be on the order of 2 to 10. Further, the epitaxial film may be designed to have two or more doped layers and two or more non-doped layers. A larger number of stackings of a non-doped layer and a doped layer may be more effective in enhancing the in-plane uniformity, because the doping density may be more averaged in the entire epitaxial film in such a case. Also in consideration of the actually required thickness of the entire epitaxial film, the number of stackings of each of non-doped layer and doped layer may preferably be more than about 20, more preferably on the order of 20 to 40.

With respect to the order of stacking of the non-doped layer and the doped layer, the growth on an SiC substrate may be a growth on a substrate having a small off-angle and therefore, it should be started by growing a layer at a low C/Si ratio, that is, a non-doped layer. On the other hand, the outermost surface may be a portion for contacting the electrode of a device and therefore, it should be a doped layer.

The C/Si ratio at the time of growing a non-doped layer may preferably be 0.5 or more and less than 1.5, in view of the growth on a low off-angle substrate. If the C/Si ratio is less than 0.5, this may tend to cause the formation of a defect called an Si droplet, which is a phenomenon such that excessive Si atoms are condensed on the substrate surface. On the other hand, if the C/Si ratio is 1.5 or more, the surface roughening or an epitaxial defect may tend to be increased. The C/Si ratio herein may be more preferably from 0.8 to 1.2.

Further, if the C/Si ratio at the time of growing a doped layer is too low, the effect of the site-competition is more liable to be occur. On the other hand, if the C/Si ratio is too high, an epitaxial defect such as triangular defect may tend to be increased. For this reason, the C/Si ratio herein may preferably be 1.5 or more and 2.0 or less, more preferably from 1.5 to 1.8. Further, the density of doping atom number in the doped layer may preferably be larger than $N_n$ and $N_{B2}$ in FIGS. 7a and 7b, and therefore, it may preferably be $1\times10^{15}$ cm$^{-3}$ or more. If the density of doping atom number is too high, the surface roughening may be caused. Therefore, the density of doping atom number may more preferably be from $1\times10^{15}$ to $1\times10^{17}$ cm$^{-3}$.

The thickness of the entire epitaxial film may Preferably be 5 μm or more and 50 μm or less, more preferably from 10 to 20 μm in consideration of the withstanding voltage of a device to be usually formed therefrom, the productivity of the epitaxial film, and the like. In addition, the off-angle of the substrate may be 1° or more and 6° or less. If the off-angle is less than 1°, the effect of the present invention may not be sufficiently brought out due to the too small off-angle. On the other hand, if the off-angle of the substrate exceeds 6°, the film can grow in a state of high C/Si ratio and the in-plane uniformity may be increased even without using the present invention.

According to the present invention, at the time of growing an epitaxial film on an SiC single crystal substrate, a plurality of non-doped layers and a plurality of doped layer are stacked, and the C/Si ratio and the layer thickness are caused to be different between that at the growth of the non-doped layer and that at the growth of the doped layer, whereby the in-plane uniformity of the doping density can be reduced to 5% or less, in terms of σ/mean. However, in this case, as seen from FIG. 7, the average value of the doping density in the portion wherein a non-doped layer and a doped layer are stacked, cannot be determined from a normal doping profile to be obtained by capacity-voltage measurement. Therefore, after the formation of an ohmic electrode on the surface of the epitaxial film and the back surface of the substrate, the in-plane uniformity of the current value between the electrodes may be evaluated provided that the current value is regarded as an equivalent to the doping density. More specifically, an ohmic electrode of Ni may be formed throughout the back surface, an Ni ohmic electrode of about 200 μm-square may be formed also on the front surface. An electric current may be applied to the ohmic electrodes on front and back surfaces, and, for example, a current value may be measured when 10 V is applied thereto.

With respect to the impurity element to be added when an epitaxial film is formed in the present invention, the above embodiment is described by mainly taking nitrogen as an example. However, the doped layer may also be formed by using an element other than nitrogen, for example, by using aluminum as the impurity. In addition, with respect to the raw material gas for the epitaxial film, the above embodiment is described by taking $SiH_4$ and $C_2H_4$ as an example. However, a silicon source or a carbon source other than these gases may be of course used.

Examples of the device which may preferably be formed on the substrate according to the present invention having the thus grown epitaxial film may include: a Schottky barrier diode, a PIN diode, an MOS diode, and an MOS transistor. Among others, from the standpoint of utilizing the low-loss property of SiC, the device to be formed on the substrate according to the present invention may preferably be, for example, a device to be used for power control. In addition, in an epitaxial film having such a high doping layer and a low doping layer, a strain may be generated at the interface due to the difference in the lattice constant between respective layers, and there may be increased the probability of being converted from a basal plane dislocation of the substrate into an edge dislocation. Accordingly, the density of basal plane dislocations which are present in the surface of the thus grown epitaxial film may be expected to be 20 dislocations/cm$^2$ or less. Further, the film quality may be enhanced due to the reduction in the dislocation density and in turn, the "n" value indicative of the diode performance when a Schottky barrier diode is formed from the film may be expected to be approximately from 1.01 to 1.03.

EXAMPLES

Example 1

An SiC single crystal ingot for a 3-inch (76 mm) wafer was sliced so as to provide a substrate having a thickness of about 400 µm, and then was subjected to roughening and normal polishing with a diamond abrasive grain to thereby prepare a silicon carbide single crystal substrate containing a 4H polytype. This substrate was n-type, and the resistivity was about 0.02Ω·cm.

On the Si surface of the thus obtained substrate, epitaxial growth was performed. The off-angle of the substrate was 4°. The growth procedure was as follows.

The substrate was set in a growth furnace and the inside of the growth furnace was evacuated, then the pressure was adjusted to $1.0 \times 10^4$ Pa while introducing thereinto a hydrogen gas at 150 L/min. Thereafter, the temperature in the growth furnace was raised to 1,600° C. while keeping the pressure constant, and the growth of a non-doped layer was started by setting the $SiH_4$ and $C_2H_4$ flow rates to 40 cm³/min and 22 cm³/min (C/Si ratio: 1.1), respectively.

After the growth of the non-doped layer to a thickness of 0.1 µm, a doped layer was grown to a thickness of 0.2 µm by setting the $SiH_4$ and $C_2H_4$ flow rates to 40 cm³/min and 30 cm³/min (C/Si ratio: 1.5), respectively, and flowing $N_2$ as the doping gas at a flow rate of 30 cm³/min (density of doping atom number: $1 \times 10^{16}$ cm$^{-3}$).

Thereafter, the introduction of $N_2$ was stopped, a non-doped layer was again grown so as to provide a thickness of 0.1 µm. Further, a doped layer was grown so as to provide a thickness of 0.2 µm by setting the $N_2$ flow rate to 30 cm³/min. Subsequently, in this way, each of a non-doped layer and a doped layer was grown 30 times in total such that the outermost layer became a doped layer.

Figure 8:
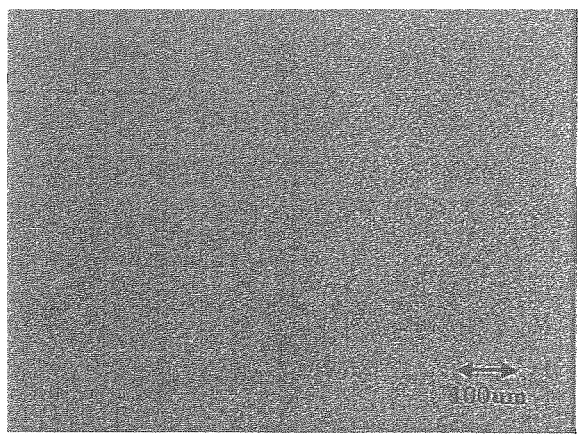
FIG. 8 is an optical micrograph showing one example of the surface state of the film at the time of performing epitaxial growth according to one embodiment of the process of the present invention.
Figure 9:
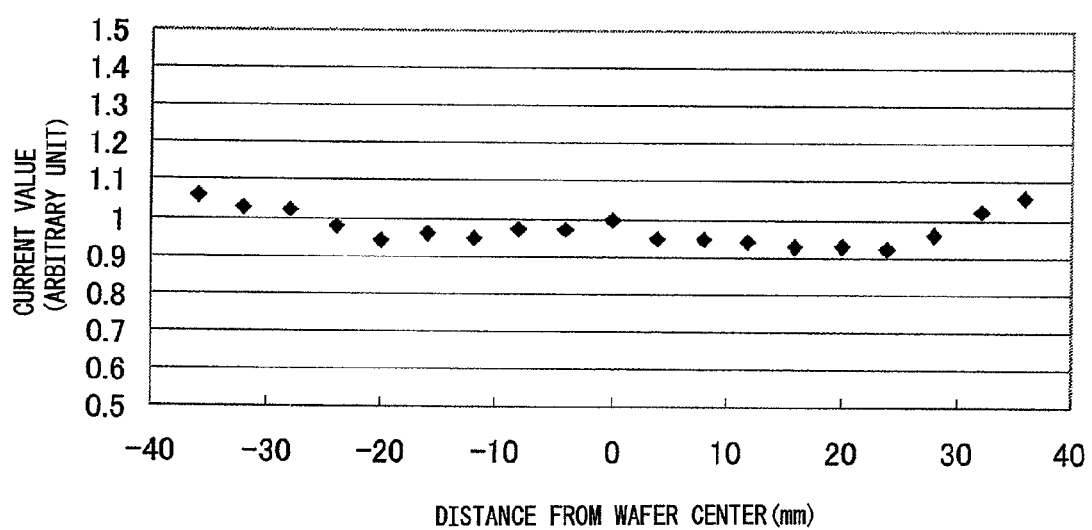
FIG. 9 is a graph showing one example of the current value distribution between the front and back surfaces at the time of performing epitaxial growth according to one embodiment of the process of the present invention.
Figure 10:
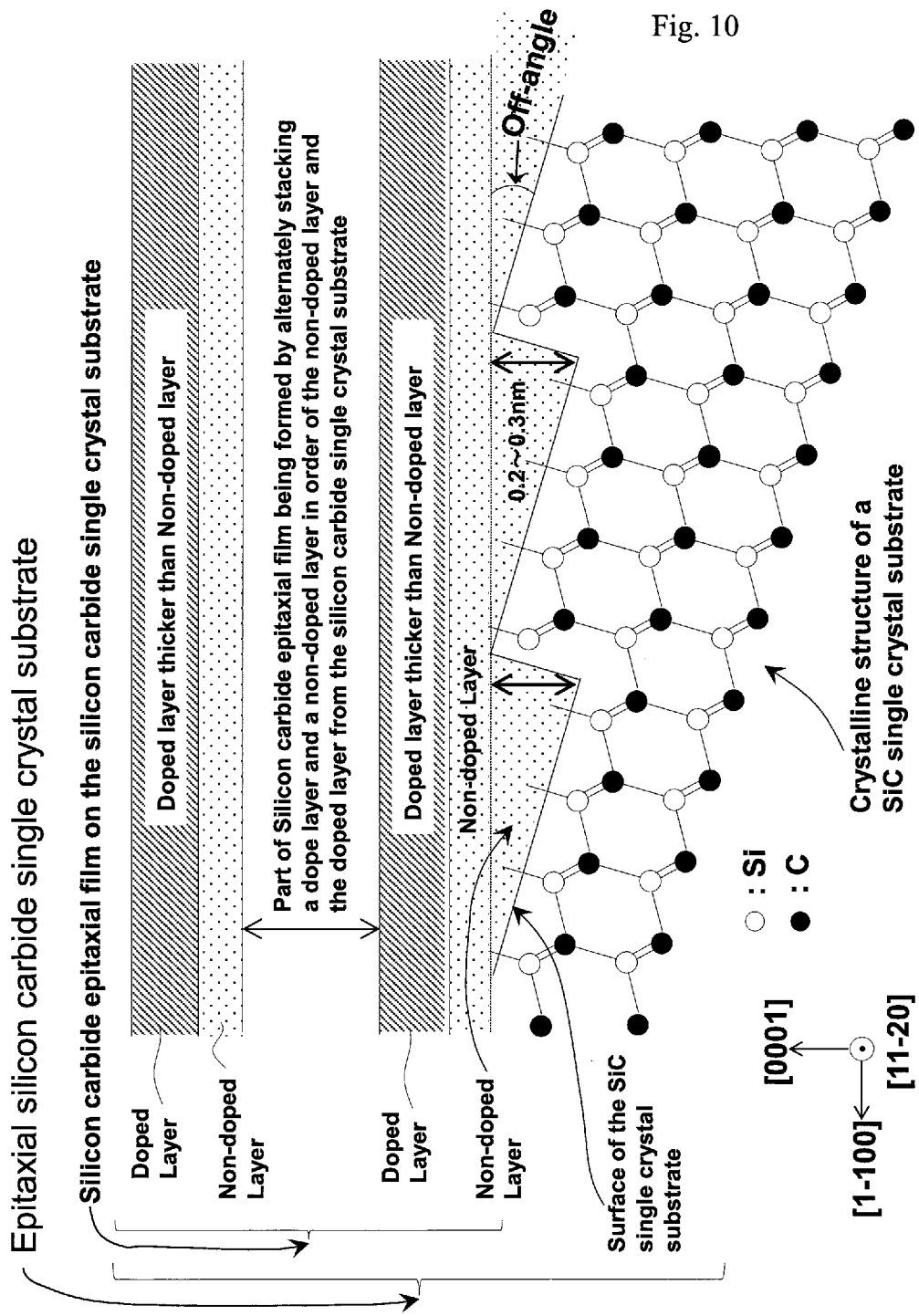
FIG. 10 is a graphical illustration of an epitaxial silicon carbide single crystal substrate with a silicon carbide epitaxial film formed on the silicon carbide single crystal substrate. As shown, the epitaxial film has two doped layers and two non-doped layers and is formed by alternately stacking a doped layer and a non-doped layer.

FIG. 8 shows an optical micrograph of the thus epitaxially grown film. It is seen from FIG. 8 that a good film with little surface roughness and few defects was obtained. As described above, an Ni ohmic electrode was formed on the epitaxial film, and the doping density was evaluated by using the current value. The thus obtained results are shown in FIG. 9. The uniformity was good, and the in-plane uniformity was 4.5% in terms of σ/mean.

Example 2

On the Si surface of a 3-inch (76 mm) SiC single crystal substrate containing a 4H polytype which had been prepared by conducting slicing, roughing and normal polishing in the same manner as in Example 1, epitaxial growth was performed. The off-angle of the substrate was 4°. This substrate was n-type, and the resistivity was about 0.02Ω·cm.

The procedure, the temperature and the like until the start of the growth were the same as those in Example 1. The growth procedure in this Example was as follows.

The growth of a non-doped layer was started by setting the $SiH_4$ and $C_2H_4$ flow rates to 40 cm³/min and 22 cm³/min (C/Si ratio: 1.1), respectively. After the growth of the non-doped layer to a thickness of 0.05 µm, a doped layer was grown so as to provide a thickness of 0.5 µm by setting the $SiH_4$ and $C_2H_4$ flow rates to 40 cm³/min and 30 cm³/min (C/Si ratio: 1.5), respectively, and flowing $N_2$ as the doping gas at a flow rate of 3 cm³/min (density of doping atom number: $1 \times 10^{15}$ cm$^{-3}$).

Thereafter, the introduction of $N_2$ was stopped, a non-doped layer was again grown so as to provide a thickness of 0.05 µm. Further, a doped layer was grown so as to provide a thickness of 0.5 µm by setting the $N_2$ flow rate to 3 cm³/min. In this way, each of a non-doped layer and a doped layer was grown 20 times in total. The thus epitaxially grown film was a good film with little surface roughness and few defects, and the in-plane uniformity evaluated by the current value was 3.5% in terms of σ/mean.

Example 3

On the Si surface of a 3-inch (76 mm) SiC single crystal substrate containing a 4H polytype which had been prepared by conducting slicing, roughing and normal polishing in the same manner as in Example 1, epitaxial growth was performed. The off-angle of the substrate was 4°. This substrate was n-type, and the resistivity was about 0.02Ω·cm.

The procedure, the temperature and the like until the start of the growth were the same as those in Example 1. The growth procedure in this Example was as follows.

The growth of a non-doped layer was started by setting the $SiH_4$ and $C_2H_4$ flow rates to 40 cm³/min and 10 cm³/min (C/Si ratio: 0.5), respectively. After the growth of the non-doped layer to a thickness of 0.1 µm, a doped layer was grown so as to provide a thickness of 0.2 µm by setting the $SiH_4$ and $C_2H_4$ flow rates to 40 cm³/min and 40 cm³/min (C/Si ratio: 2.0), respectively, and flowing $N_2$ as the doping gas at a flow rate of 30 cm³/min (density of doping atom number: $1 \times 10^{16}$ cm$^{-3}$).

Thereafter, the introduction of $N_2$ was stopped, a non-doped layer was again grown so as to provide a thickness of 0.1 µm. Further, a doped layer was grown so as to provide a thickness of 0.2 µm by setting the $N_2$ flow rate to 30 cm³/min. In this way, each of a non-doped layer and a doped layer was grown 30 times in total.

The thus epitaxialiy grown film was a good film with little surface roughness and few defects, and the in-plane uniformity evaluated by the current value was 4.7% in terms of σ/mean.

Example 4

On the Si surface of a 3-inch (76 mm) SiC single crystal substrate containing a 4H polytype which had been prepared by conducting slicing, roughing and normal polishing in the same manner as in Example 1, epitaxial growth was performed. The off-angle of the substrate was 4°. This substrate was n-type, and the resistivity was about 0.02Ω·cm.

The procedure, the temperature and the like until the start of growth were the same as those in Example 1. The growth procedure in this Example was as follows.

the growth of a non-doped layer was started by setting the $SiH_4$ and $C_2H_4$ flow rates to 40 cm³/min and 10 cm³/min (C/Si ratio: 0.5), respectively. After the growth of the non-doped layer to a thickness of 0.05 µm, a doped layer was grown so as to provide a thickness of 0.5 µm by setting the $SiH_4$ and $C_2H_4$ flow rates to 40 cm³/min and 40 cm³/min (C/Si ratio: 2.0), respectively, and flowing $N_2$ as the doping gas at a flow rate of 300 cm³/min (density of doping atom number: $1 \times 10^{17}$ cm$^{-3}$).

Thereafter, the introduction of $N_2$ was stopped, a non-doped layer was again grown so as to provide a thickness of 0.05 µm. Further, a doped layer was grown so as to provide a thickness of 0.5 µm by setting the $N_2$ flow rate to 300 cm³/min. In this way, each of a non-doped layer and a doped layer was grown 20 times in total.

The thus epitaxially grown film was a good film with little surface roughness and few defects, and the in-plane uniformity evaluated by the current value was 4.0% in terms of σ/mean.

Example 5

On the Si surface of a 3-inch (76 mm) SiC single crystal substrate containing a 4H polytype which had been prepared by conducting slicing, roughing and normal polishing in the same manner as in Example 1, epitaxial growth was performed. The off-angle of the substrate was 1°. This substrate was n-type, and the resistivity was about 0.02Ω·cm.

The procedure, the temperature and the like until the start of growth were the same as those in Example 1. The growth procedure in this Example was as follows.

The growth of a non-doped layer was started by setting the $SiH_4$ and $C_2H_4$ flow rates to 40 $cm^3$/min and 10 $cm^3$/min (C/Si ratio: 0.5), respectively. After the growth of the non-doped layer to a thickness of 0.1 μm, a doped layer was grown so as to provide a thickness of 0.2 μm by setting the $SiH_4$ and $C_2H_4$ flow rates to 40 $cm^3$/min and 30 $cm^3$/min (C/Si ratio: 1.5), respectively, and flowing $N_2$ as the doping gas at a flow rate of 30 $cm^3$/min (density of doping atom number: $1\times10^{16}$ $cm^{-3}$).

Thereafter, the introduction of $N_2$ was stopped, a non-doped layer was again grown so as to provide a thickness of 0.1 μm. Further, a doped layer was grown so as to provide a thickness of 0.2 μm by setting the $N_2$ flow rate to 30 $cm^3$/min. In this way, each of a non-doped layer and a doped layer was grown 30 times in total.

The thus epitaxially grown film was a good film with little surface roughness and few defects, and the in-plane uniformity evaluated by the current value was 4.8% in terms of σ/mean.

Example 6

On the Si surface of a 3-inch (76 mm) SiC single crystal substrate containing a 4H polytype which had been prepared by conducting slicing, roughing and normal polishing in the same manner as in Example 1, epitaxial growth was performed. The off-angle of the substrate was 6°. This substrate was n-type, and the resistivity was about 0.02Ω·cm.

The procedure, the temperature and the like until the start of growth were the same as those in Example 1. The growth procedure in this Example was as follows.

The growth of a non-doped layer was started by setting the $SiH_4$ and $C_2H_4$ flow rates to 40 $cm^3$/min and 22 $cm^3$/min (C/Si ratio: 1.1), respectively. After the growth of the non-doped layer to a thickness of 0.1 μm, a doped layer was grown so as to provide a thickness of 0.2 μm by setting the $SiH_4$ and $C_2H_4$ flow rates to 40 $cm^3$/min and 30 $cm^3$/min (C/Si ratio: 1.5), respectively, and flowing $N_2$ as the doping gas at a flow rate of 30 $cm^3$/min (density of doping atom number: $1\times10^{16}$ $cm^{-3}$).

Thereafter, the introduction of $N_2$ was stopped, a non-doped layer was again grown so as to provide a thickness of 0.1 μm. Further, a doped layer was grown so as to provide a thickness of 0.2 μm by setting the $N_2$ flow rate to 30 $cm^3$/min. In this way, each of a non-doped layer and a doped layer was grown 30 times in total.

The thus epitaxially grown film was a good film with little surface roughness and few defects, and the in-plane uniformity evaluated by the current value was 4.2% in terms of σ/mean.

Comparative Example 1

As Comparative Example, on the Si surface of a 3-inch (76 mm) SiC single crystal substrate containing a 4H polytype which had been prepared by conducting slicing, roughing and normal polishing in the same manner as in Example 1, epitaxial growth was performed. The off-angle of the substrate was 4°.

The procedure, the temperature and the like until the start of growth were the same as those in Example 1, but in the growth, a doped layer was grown so as to provide a thickness of 10 μm by setting the $SiH_4$ and $C_2H_4$ flow rates to 40 $cm^3$/min and 22 $cm^3$/min (C/Si ratio: 1.1), respectively, and flowing $N_2$ as the doping gas at a flow rate of 1 $cm^3$ (density of doping atom number: $1\times10^{16}$ $cm^{-3}$).

The thus epitaxially grown film was a good film with little surface roughness and few defects, but the in-plane uniformity evaluated by the current value was 15% in terms of σ/mean.

INDUSTRIAL APPLICABILITY

The present invention can provide an epitaxial SiC single crystal substrate having a high-quality epitaxial film capable of achieving an excellent in-plane uniformity of the doping density in the epitaxial growth on an SiC single crystal substrate. Accordingly, when an electronic device is formed on the thus obtained substrate, there can be expected an improvement in the characteristics and yield of the device. In Examples of the present invention, $SiH_4$ and $C_2H_4$ are used as raw material gases, but the same results can be obtained also in a case where trichlorosilane is used as an Si source and $C_3H_8$ or the like is used as a C source.

The invention claimed is:

1. An epitaxial silicon carbide single crystal substrate, comprising:
a silicon carbide single crystal substrate having an off-angle of 1 to 6°, and a silicon carbide epitaxial film formed on the silicon carbide single crystal substrate by use of a chemical vapor deposition method,
wherein the epitaxial film has two or more doped layers and two or more non-doped layers, and is formed by alternately stacking a doped layer having a thickness of 0.5 μm or less and being formed while adding an impurity element; and a non-doped layer having a thickness of 0.1 μm or less and being formed without the addition of an impurity element, in order of the non-doped layer and the doped layer from the silicon carbide single crystal substrate,
wherein the doped layer is formed by setting the ratio of numbers of carbon and silicon atoms (C/Si) contained in a raw material gas for epitaxial film to be 1.5 or more and 2.0 or less, and the non-doped layer is formed by setting the ratio of numbers of carbon and silicon atoms (C/Si) contained in a raw material gas for epitaxial film to be 0.5 or more and less than 1.5,
wherein the thickness of the doped layer is larger than the thickness of the non-doped layer, and
wherein the density of doping atom number of the doped layer is $1\times10^{15}$ $cm^{-3}$ to $1\times10^{17}$ $cm^{-3}$.

2. A process for producing an epitaxial silicon carbide single crystal substrate by forming a silicon carbide epitaxial film on a silicon carbide single crystal substrate having an off-angle of 1 to 6° by use of a chemical vapor deposition method; the process comprising alternately the steps of:
growing a doped layer having a thickness of 0.5 μm or less, and being formed while adding an impurity element by setting the ratio of numbers of carbon and silicon atoms (C/Si) contained in a raw material gas for epitaxial film to be 1.5 or more and 2.0 or less, and growing a non-doped layer having a thickness of 0.1 μm or less, and being formed without the addition of an impurity element by setting the ratio of numbers of carbon and silicon atoms (C/Si) contained in a raw material gas for epitaxial film to be 0.5 or more and less than 1.5, to thereby form a silicon carbide epitaxial film having two or more doped layers and two or more non-doped layers in order of the non-doped layer and the doped layer from the silicon carbide single crystal substrate, wherein the thickness of the doped layer is larger than the thickness of the non-doped layer, and wherein the density of doping atom number of the doped layer is $1\times10^{15}$ cm$^{-3}$ to $1\times10^{17}$ cm$^3$.

* * * * *